United States Patent [19]

Ono et al.

[11] 4,378,540
[45] Mar. 29, 1983

[54] ACOUSTIC SURFACE WAVE DEVICE

[75] Inventors: Masaaki Ono; Noboru Wakatsuki, both of Kawasaki, Japan

[73] Assignee: Fujitsu Limited, Kawasaki, Japan

[21] Appl. No.: 227,092

[22] PCT Filed: May 7, 1980

[86] PCT No.: PCT/JP80/00096
§ 371 Date: Jan. 8, 1981
§ 102(e) Date: Dec. 19, 1980

[87] PCT Pub. No.: WO80/02485
PCT Pub. Date: Nov. 13, 1980

[30] Foreign Application Priority Data

May 8, 1979 [JP] Japan .................................. 54-55208

[51] Int. Cl.³ .............................................. H03H 9/64
[52] U.S. Cl. ...................................... 333/194; 333/195

[58] Field of Search ............................ 333/150–155, 333/193–196; 310/313 R, 313 A, 313 B, 313 C, 313 D; 29/25.35

[56] References Cited

U.S. PATENT DOCUMENTS 3,803,520 4/1974 Bristol et al. .................... 310/313 B
4,079,342 3/1978 Solie ............................... 310/313 D Primary Examiner—Marvin L. Nussbaum
Attorney, Agent, or Firm—Staas & Halsey

[57] ABSTRACT

An acoustic surface wave device comprising: a piezoelectric substrate; a pair of input and output transducers located diagonally from each other; and a multistrip coupler between the two transducers. In this device, the spacing of electrodes of at least one of the transducers is $3\lambda/4$ ($\lambda$: wavelength of the acoustic surface waves) and, accordingly, the resulting spurious frequency response is excluded by using the transfer characteristics of the multistrip coupler.

7 Claims, 12 Drawing Figures

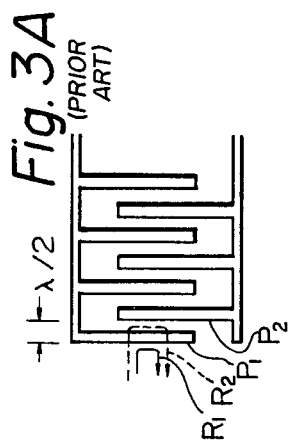
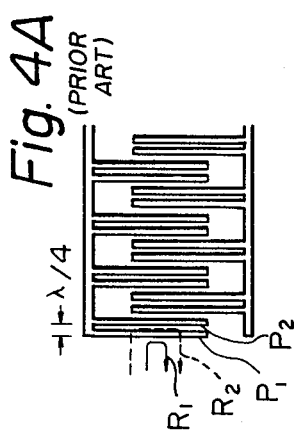
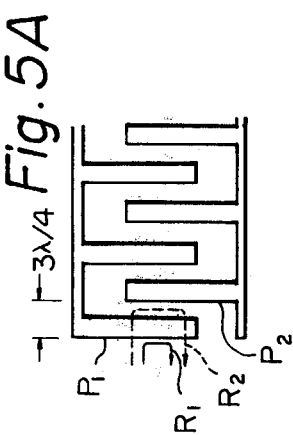
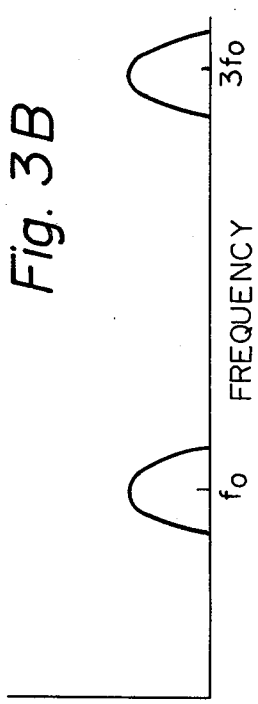
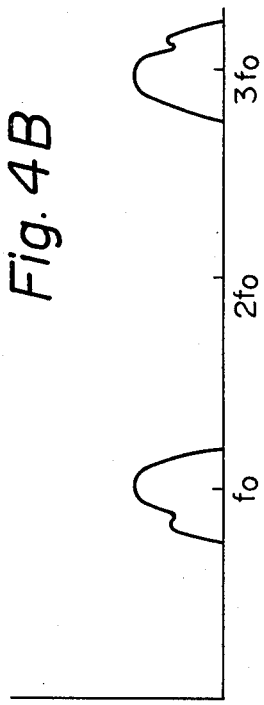
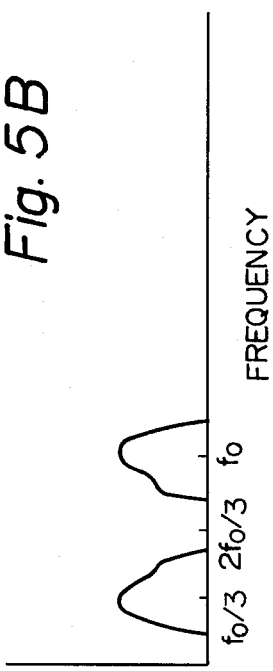

ACOUSTIC SURFACE WAVE DEVICE

BACKGROUND OF THE INVENTION

The present invention relates to an acoustic surface wave device which serves as a bandpass filter, a delay line or the like.

In general, conversion from acoustic surface waves propagating across a piezoelectric material, such as $LiNbO_3$ or $LiTaO_3$, to electrical energy and vice versa is carried out by a transducer which is conventionally composed of a pair of separated, interdigitated comb-shaped electrodes formed on the surface of the piezoelectric material.

One conventional acoustic surface device comprises a piezoelectric substrate having a planer surface for propagation of acoustic surface waves and a pair of input and output transducers formed on the surface of the substrate. When an electrical signal is applied to the input transducer, the electrical signal is converted into acoustic surface waves which are propagated to the output transducer. As a result, the acoustic surface waves are again converted into electrical signals by the output transducer. There are mainly three kinds of such acoustic waves, which reach the output transducer, as follows:

(1) desired acoustic surface waves which are launched by the input transducer and are propagated on the surface of the substrate to reach the output transducer;

(2) bulk waves which are launched by the input transducer and are propagated through the body of the substrate to reach the output transducer, and;

(3) surface reflections which are launched by the input transducer and are reflected by the output transducer and, in addition, are reflected by the input transducer to reach the output transducer.

A surface reflection as mentioned above is called a triple transit echo (hereinafter referred to as a TTE), since the reflections travel three times between the input and output transducers. Both of the bulk waves and the TTE reduce the bandpass characteristics, since their transit times are different from that of the desired acoustic surface waves.

Another conventional acoustic surface wave device comprises: a piezoelectric substrate having a planer surface for propagation of acoustic surface waves; an input transducer formed on the surface of the substrate for converting electrical energy into the acoustic surface waves; an output transducer formed on the surface of the substrate and located diagonally with respect to the input transducer, for converting the acoustic surface waves into electrical energy; and a multistrip coupler (hereinafter referred to as an MSC), including a plurality of parallel and equally spaced conductors, formed on the surface of the substrate and interposed between the input and output transducers so as to be substantially orthogonal to the propagation direction of the acoustic surface waves launched by the input transducer. The MSC transfers the propagation direction of acoustic surface waves from one track to another track. In other words, the MSC serves as an acoustic surface wave path changer only for the acoustic surface waves, not for bulk waves which travel through the body of the substrate. Therefore, the bulk waves can be prevented from reaching the output transducer. The MSC which is used for such a purpose has been designed by paying attention to wide bandpass characteristics. The characteristics of the input and output transducers are determined by weighting the cross-length of bamboo-blind shaped electrodes, i.e., by weighting electrodes.

On the other hand, the use of double electrode structures in the electrode of the transducer is known to provide a useful improvement in the level of TTE (Ref. ELECTRONICS LETTERS, Vol. 10, No. 24). In the double electrode structures, the spacing of electrodes is $\lambda/4$ where $\lambda$ is the wavelength of the desired acoustic surface waves. Therefore, the difference in phase between two reflections from two adjacent electrodes is $\pi$ and, accordingly, all reflections are diminished. However, in the acoustic surface wave device using transducers having bamboo-blind shaped electrodes, spurious signals, in addition the desired response in the proximity of the frequency $f_o$, are present in the proximity of the frequency $3f_o$ where $f_o$ is the frequency of the desired acoustic surface waves, which also result in reduction of the response characteristics of the stopband frequencies of the device.

SUMMARY OF THE INVENTION

It is an object of the invention to provide an acoustic surface wave device used as a bandpass filter or the like in which spurious responses, which reduce the response characteristics in the stopband frequencies, are suppressed.

According to the present invention, there is provided an acoustic surface wave device comprising: a piezoelectric substrate having a planer surface for propagation of acoustic surface waves; an input transducer formed on the surface of said substrate, for converting electrical energy into said acoustic surface waves; an output transducer formed on the surface of said substrate and located diagonally with respect to said input transducer, for converting the acoustic surface waves back into electrical energy, at least one of said input and output transducers having electrodes whose spacing is about $3\lambda/4$ where $\lambda$ is a wavelength of said acoustic surface; and a multistrip coupler including a purality of parallel and equally spaced conductors, formed on the surface of said substrate and interposed between said input and output transducers so as to be substantially orthogonal to the propagation direction of said acoustic surface waves, the number and spacing of said conductors being selected so that said multistrip coupler hardly transfers undesired acoustic surface waves which are in the vicinity of a frequency $f_o/3$ where $f_o$ is the frequency of said acoustic surface waves. In the transducer in which the spacing of electrodes is $3\pi/4$, the difference in phase between two reflections from two adjacent electrodes is $3\pi$ and, accordingly, the composite reflections are small. In the device using such a transducer, spurious signals are also present in the vicinity of the frequency $f_o/3$. However, by proper selection of the number and spacing of the conductors of the MSC in the present invention, the MSC can not transfer the spurious signals. Therefore, the spurious signals can also be excluded.

BRIEF EXPLANATION OF THE DRAWINGS

FIG. 3A is a partial plan view of transducers 2 and 3;

FIG. 3B is a graph showing the frequency response characteristics of the device of FIG. 2 using the transducer of FIG. 3A;

FIG. 4A is a modification of FIG. 3A;

FIG. 4B is a graph showing the frequency response characteristics of the device of FIG. 2 using the transducer of FIG. 4A;

FIG. 5A is a partial plan view of a transducer according to the present invention;

FIG. 5B is a graph showing the frequency response characteristics of the device of FIG. 2 using the transducer of FIG. 5A;

DESCRIPTION OF THE PREFERRED EMBODIMENT

Figure 1:
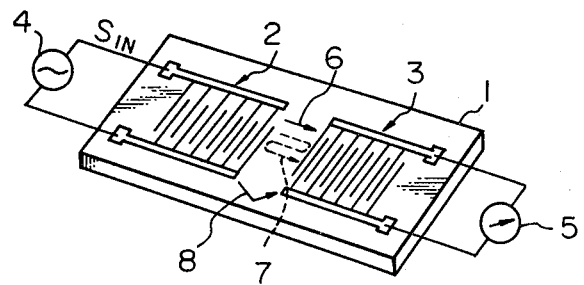
FIG. 1 is a perspective view illustrating a conventional acoustic surface wave device.

Referring to FIG. 1, which illustrates a conventional acoustic surface wave device, an input transducer 2 and an output transducer 3, each of which is composed of two separated, interdigitated comb-shaped electrodes, are formed on the surface of a piezoelectric substrate 1. When an electrical signal $S_{IN}$ from a tracking generator 4 is applied to the two electrodes of the input transducer 2, the electrical signal is converted into acoustic surface waves 6 which are again converted into an electrical signal by the output transducer 3, which is connected to a load impedance 5. Therefore, the device of FIG. 1 serves as a bandpass filter or a delay line. However, in the device of FIG. 1, reflections 7 or triple transit echos which travel three times between the transducers 2 and 3, and bulk waves 8, which travel through the body of the substrate 1, reach the output transducer 3 and, accordingly, the bandpass characteristics are degraded, since the transit times of the reflections 7 and the bulk waves 8 are different from those of the desired acoustic surface waves 6.

Figure 2:
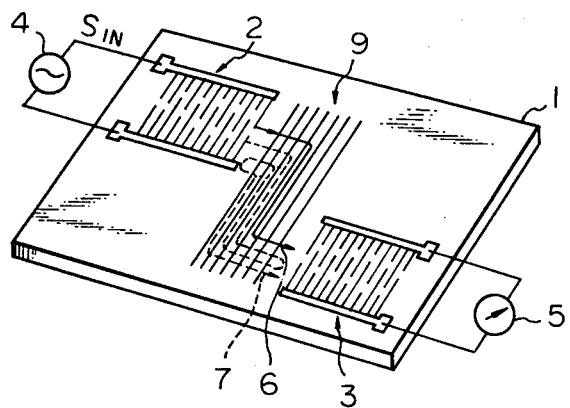
FIG. 2 is a perspective view illustrating another conventional acoustic surface wave device.

FIG. 2 is a perspective view illustrating another conventional acoustic surface wave device. In FIG. 2, the input and output transducers 2 and 3 have bamboo-blind shaped electrodes, and an MSC 9 composed of a plurality of parallel and equally spaced conductors is provided between the input and output transducers 2 and 3 which are located diagonally with respect to each other. The MSC serves as a path changer for the acoustic surface waves 6 as well as the reflections 7, but not of the bulk waves 8 (FIG. 1). In this case, the most simple spacing of the electrodes of the transducers 2 and 3 is $\lambda/2$ where $\lambda$ is a wavelength of the desired acoustic surface waves 6. In this case, transmission efficiency is determined by the frequency, the spacing of electrodes of the input and output transducers 2 and 3, and the cross-length state of the bamboo-blind shaped electrodes.

FIG. 3A is a partial plan view of a transducer 2 or 3. In FIG. 3A, as mentioned above, the spacing of the electrodes is $\lambda/2$. Therefore, the difference in phase between two reflections from the first and second electrodes $P_1$ and $P_2$ is $2\pi$; in other words, the reflection $R_1$ is in phase with the reflection $R_2$. As a result, reflections from all the electrodes add cumulatively, so that the composite reflection is large. Therefore, in the device of FIG. 2 using the transducers of FIG. 3A, large TTEs due to acoustic discontinuities are present. As illustrated in FIG. 3B, which illustrates the frequency response characteristics of the device of FIG. 2 using the transducers of FIG. 3A, responses are symmetrical about $f_o$, and odd-order harmonics other than the desired frequency $f_o$ are present in the vicinity of $3f_o$.

FIG. 4A is a modification of FIG. 3A. In FIG. 4A, double electrode structures are shown and the spacing of the electrodes is $\lambda/4$. Therefore, the difference in phase between two reflections $R_1$ and $R_2$ from the electrodes $P_1$ and $P_2$ is $\pi$; in other words, the reflection $R_1$ is in reverse phase to the reflection $R_2$. As a result, all the reflections are diminished so that the composite reflection is small. Therefore, in the device of FIG. 2 using the transducer of FIG. 4A, TTEs are not present. However, in FIG. 4B, which illustrates the frequency response characteristics of the device of FIG. 2 using the transducer of FIG. 4A, asymmetrical responses can be obtained, but high-order harmonics are present, the same as in FIG. 3B, and, accordingly spurious signals are present in the vicinity of the frequency $3f_o$. In order to reduce such spurious signals, in the prior art, the spacing of electrodes of the input transducer is a bit different from that of the output transducer. However, in this case, the reduction of such spurious signals is small.

FIG. 5A is a partial plan view of a transducer according to the present invention. In FIG. 5A, the spacing of the electrodes is $3\lambda/4$. Therefore, the difference in phase between two reflections $R_1$ and $R_2$ from the first and second electrodes $P_1$ and $P_2$ and $3\pi$; in other words, the reflection $R_1$ is in reverse phase to the reflection $R_2$. As a result, all the reflections are diminished, so that the composite reflection is small. Therefore, in the device of FIG. 2 using the transducer of FIG. 5A, TTEs are not present. However, in FIG. 5B, which illustrates the frequency response characteristics of the device of FIG. 2 using the transducer of FIG. 5A, spurious signals are present in the vicinity of a frequency $f_o/3$. In the present invention, the spurious signals are reduced by using the transfer characteristics of the MSC.

Figure 6:
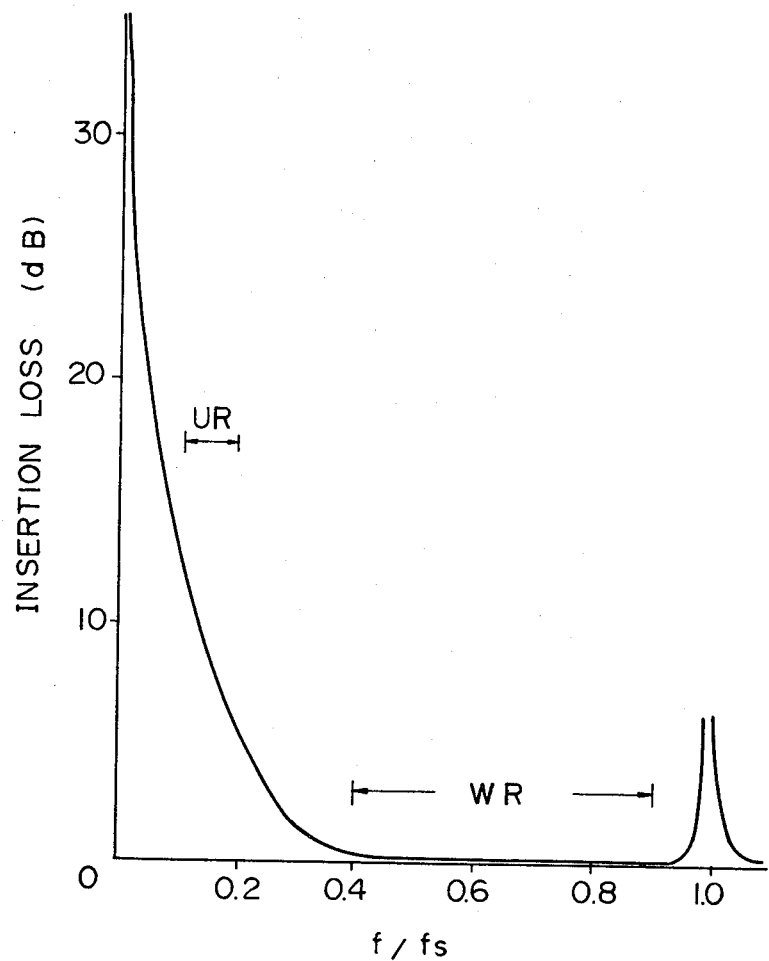
FIG. 6 is a graph showing the frequency response characteristics of the MSC of FIG. 2.

FIG. 6 is a graph showing an example of the transfer characteristics of the MSC of FIG. 2. In FIG. 6, $f_s$, which is a stopband frequency, is defined as follows.

$$f_s = (V/2d)$$

where
v is the velocity of the acoustic surface waves,
d is the spacing of conductors.

In addition, insertion loss is defined as follows.

$$\text{Insertion loss} = 10 \log (A/B)$$

where
A is an acoustic surface wave energy launched by the input transducer to the MSC,
B is an acoustic surface wave energy transferred from the MSC to the output transducer.

As illustrated in FIG. 6, within a range WR, the insertion loss is almost zero; in other words, almost 100 percent transfer of energy is carried out. Therefore, the frequency $f_o$ of the desired acoustic surface waves should be within the range WR. For example, $$0.4 < f_o/f_s < 0.9 \qquad (1)$$

Contrary to this, the frequency $f_o/3$ should be outside of the range WR, in which the insertion loss is large.

For example, if the frequency $f_o/3$ is within the range UR, then $$0.1 < f_o/3f_s < 0.2 \quad (2)$$
$$\therefore 0.3 < f_o/f_s < 0.6$$

From the formulae (1) and (2), $$0.4 < f_o/f_s < 0.6 \quad (3)$$

Thus, the undesired spurious signals can be excluded by selecting the number and the spacing of the conductors of the MSC so that the stopband frequency $f_s$ of the MSC satisfies the formula (3).

It should be noted that, if the spurious signals of the frequency $3f_o$ as illustrated in FIG. 4B are reduced by the MSC, then the frequency should satisfy the following equation.

$$3f_o/f = 1 \quad (2)'$$
$$\therefore f_o/f_s = 0.333$$

In addition, the frequency $f_o$ of the desired acoustic surface waves should satisfy the above-mentioned formula (1). However, the two formulae (1) and (2)' do not coexist with each other. Therefore, in case the spacing of electrodes is $\lambda/4$, it is impossible for the spurious signals to be excluded by the MSC.

The experimental examples according to the present invention will be now explained.

Figure 7:
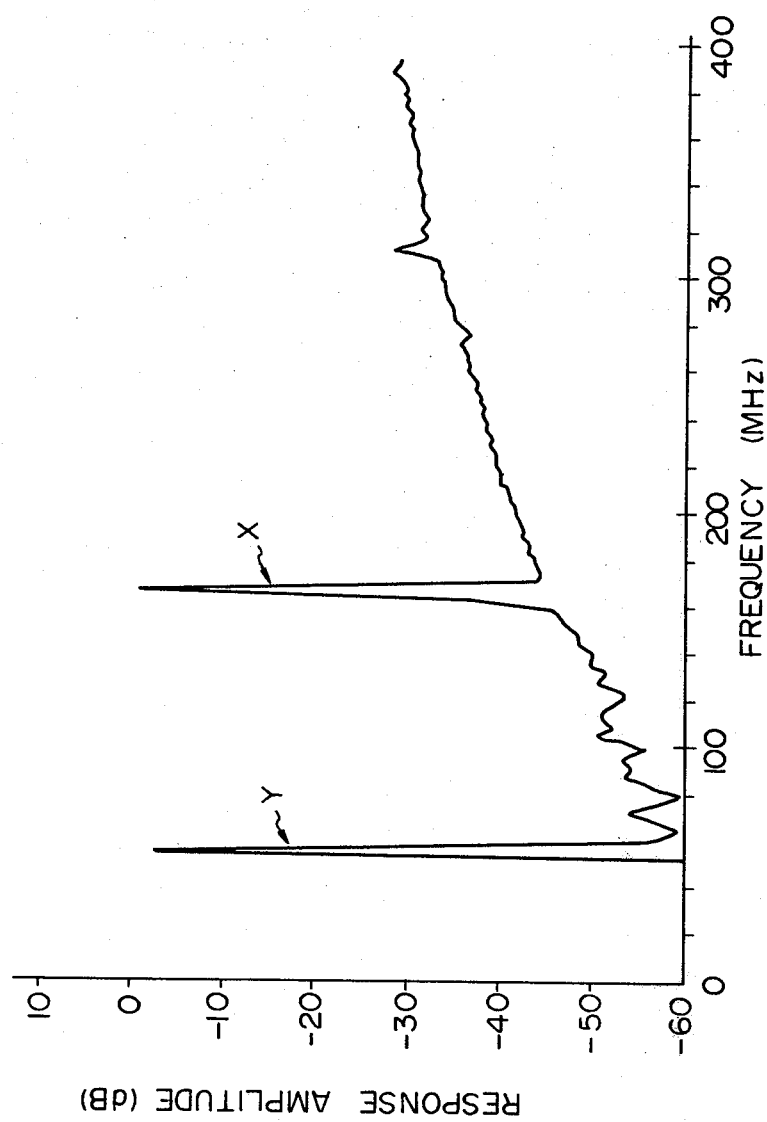
FIGS. 7, 8 and 9 are graphs showing the frequency response characteristics as experimental examples according to the present invention.

FIG. 7 shows a first experimental example according to the present invention. The acoustic surface device used in the experimental example of FIG. 7 is manufactured with the following conditions.

(1) Substrate
Material: Y-LiNbO$_3$ of 128 degree rotation
Thickness: 0.5 mm
Direction of propagation: X-direction
(2) Input transducer
Crosswidth: 1 mm
Spacing of electrodes: 17.8μ
Number of electrodes: 90
(3) Output transducer
Cross-width: 1 mm
Spacing of electrodes: 17.8μ
Number of electrodes: 150
(4) MSC
Cross-width: 2.1 mm
Spacing of conductors: 5.0μ
Number of conductors: 100

It should be noted that the electrodes of the input transducers are weighted so that the frequency response characteristics are asymmetrical. In this example, the spacing of electrodes of the input and output transducers is $3\lambda/4$. Therefore, a desired frequency response $X(f_o=168$ MHz$)$ and a spurious frequency response $Y(f_o/3=56$ MHz$)$, which are both at the same level, are obtained.

Figure 8:
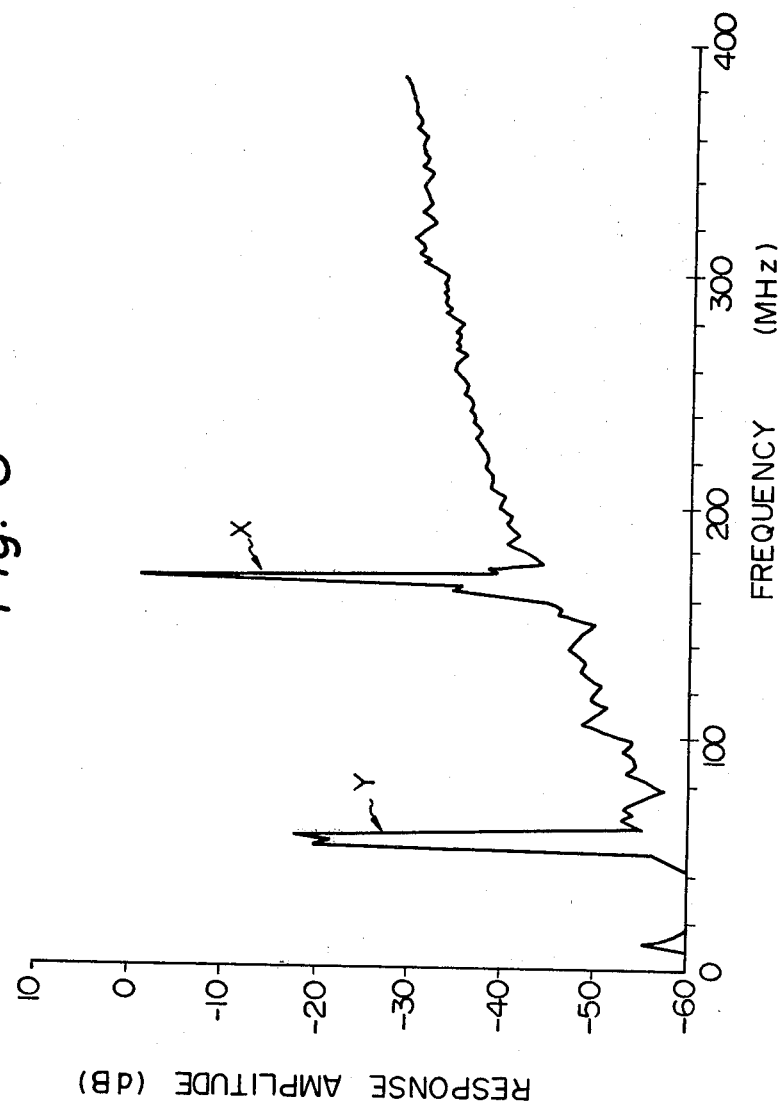

FIG. 8 shows a second experimental example according to the present invention. In this example, the following conditions are different from those of the first example.

Spacing of electrodes of the input transducer: 18.1μ
Spacing of electrodes of the output transducer: 17.5μ
Thus, since each of the frequency responses is asymmetrical, one of the responses X and Y becomes larger, while the other becomes smaller. In FIG. 8, the spurious frequency response Y is 18 dB lower than the desired frequency response X.

Figure 9:
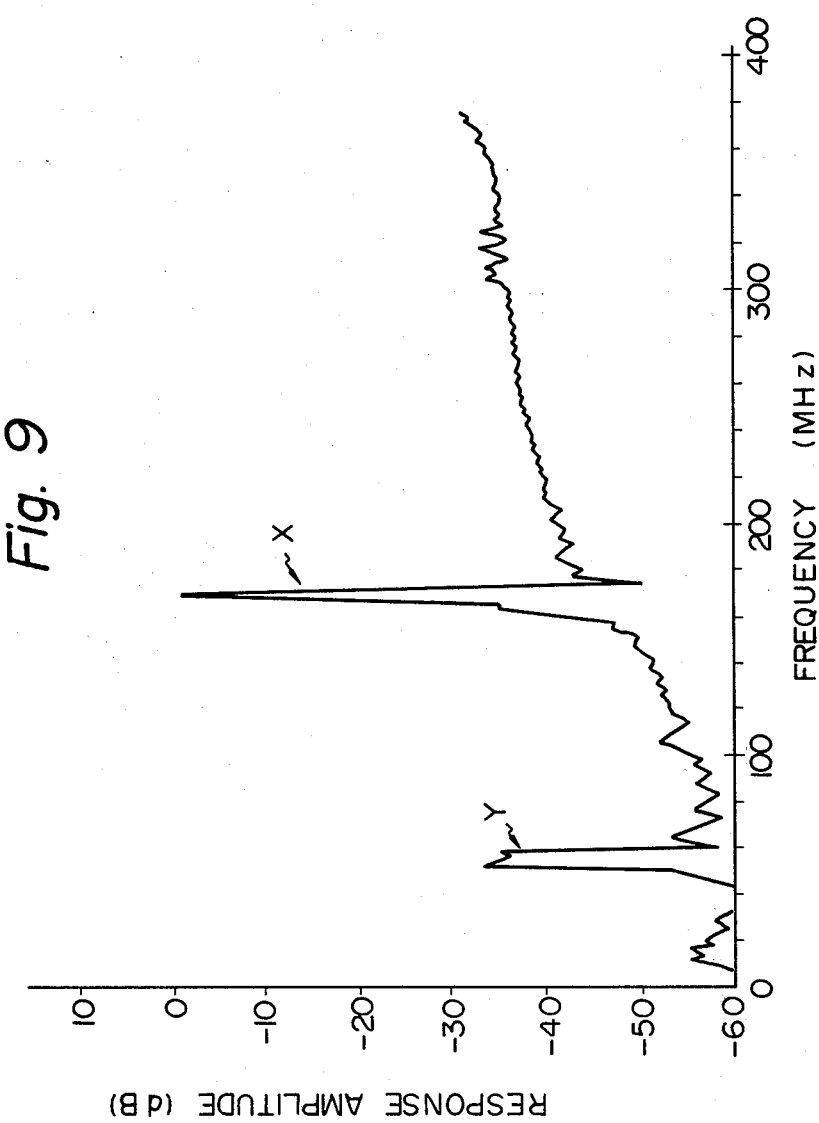

FIG. 9 shows a third experimental example according to the present invention. In this example, the following condition is different from that of the second example.

Spacing of conductors of the MSC: 1.2μ Thus, at the frequency 56 MHz of the spurious frequency response Y, the insertion loss of the MSC is large. On the other hand, the desired frequency response X remains within a range in which the insertion loss is small. As a result, the spurious frequency response Y is 35 dB lower than the desired frequency response X.

Of course, if only the insertion loss is large at the frequency 56 MHz, the spurious frequency response Y is much lower than the desired frequency response X, even when the spacing of electrodes of the input transducer is the same as that of the output transducer.

As explained hereinbefore, the acoustic surface wave device according to the present invention the advantage, as compared with the prior art, of suppressing spurious signals which reduce the stopband characteristics.

What is claimed is:

1. An acoustic surface wave device comprising:
   a piezoelectric substrate having a planer surface for propagation of acoustic surface waves;
   an input transducer formed on the surface of said substrate, for converting electrical energy into said acoustic surface waves;
   an output transducer formed on the surface of said substrate and located diagonally with respect to said input transducer, for converting said acoustic surface waves into electrical energy, at least one of said input and output transducers having electrodes whose spacing is about $3\lambda/4$ where $\lambda$ is the wavelength of said acoustic surface waves; and
   a multistrip coupler including a plurality of parallel and equally spaced conductors, formed on the surface of said substrate and interposed between said input and output transducers so as to be substantially orthogonal to the propagation direction of said acoustic surface waves, the number and spacing of said conductors being selected to reduce the transfer of undesired acoustic surface waves which are in the vicinity of the frequency $f_o/3$ where $f_o$ is the frequency of said acoustic surface waves.

2. A device as set forth in claim 1, wherein at least one of said input and output transducers is provided with weighted electrodes so as to obtain asymmetrical frequency response characteristics.

3. A device as set forth in claim 2, wherein the spacing of electrodes of said input transducer is slightly different from that of said output transducer.

4. An improved acoustic wave device of the type which generates a desired response at a frequency $f_o$ by using a piezoelectric substrate, input and output transducer means mounted on the substrate at spaced-apart positions, and wave directing means mounted on the substrate for directing acoustic surface waves generated by the input transducer means toward the output transducer means, said transducer means having a tendency to produce a spurious response at a frequency other than $f_o$, wherein the improvement comprises:
   one of said input and output transducer means comprises means for substantially limiting the frequency of the spurious response produced to a fractional value of $f_o$; and the wave directing means comprises means for attenuating the spurious response at the fractional value of $f_o$ more than the desired response at $f_o$.

5. The device of claim 4, wherein one of the input and output transducer means comprises a pair of interdigitated comb-shaped electrodes formed on the surface of the substrate at spaced-apart positions, the spacing between the electrodes being substantially three fourths of the wavelength of the acoustic surface waves at $f_o$.

6. The device of claim 5, wherein the wave directing means comprises a multistrip coupler positioned between the input and output transducer means, the multistrip coupler having a plurality of substantially parallel conductors whose spacing is substantially one half of the velocity of the acoustic surface wave divided by the frequency of the spurious response.

7. The device of claim 6, wherein both of the input and output transducer means comprise a pair of interdigitated comb-shaped electrodes formed on the surface of the substrate at spaced-apart positions, the spacing between the electrodes of each of the input and output transducer means being substantially three fourths of the wavelength of the acoustic surface waves at $f_o$ but the spacing between the electrodes of the input transducer means being unequal to the spacing between the electrodes of the output transducer means.

* * * * *

UNITED STATES PATENT AND TRADEMARK OFFICE
CERTIFICATE OF CORRECTION

PATENT NO. : 4,378,540

DATED : March 29, 1983

INVENTOR(S) : Ono et al

It is certified that error appears in the above-identified patent and that said Letters Patent is hereby corrected as shown below:

Column 2, line 15, after "addition" insert -- to --;
          line 59, "can not" should read -- cannot --.
Column 5, line 21, "$3f_o/f=1$" should read -- $3f_o/f_s=1$ --.

Column 6, line 19, after "invention" insert -- has --

Signed and Sealed this

Twenty-eighth Day of February 1984

[SEAL]

Attest:

GERALD J. MOSSINGHOFF

Attesting Officer    Commissioner of Patents and Trademarks